United States Patent [19]

McGowan

[11] 3,968,458
[45] July 6, 1976

[54] MICROWAVE POWER REFLECTOR USING EDGE-GUIDED MODE

[75] Inventor: Joseph W. McGowan, Monmouth, N.J.

[73] Assignee: The United States of America as represented by the Secretary of the Army, Washington, D.C.

[22] Filed: Sept. 26, 1975

[21] Appl. No.: 617,209

[52] U.S. Cl. ............................ 333/24.2; 330/53; 330/124 R; 330/147; 333/84 M
[51] Int. Cl.² .......................................... H01P 1/36
[58] Field of Search ................. 333/1.1, 24.1, 24.2, 333/955

[56] References Cited
UNITED STATES PATENTS
3,845,413  10/1974  Chiron et al. ...................... 333/1.1

Primary Examiner—Paul L. Gensler
Attorney, Agent, or Firm—Nathan Edelberg; Jeremiah G. Murray; Frank Dynda

[57] ABSTRACT

An edge-guided mode microstrip device similar to an edge-guided mode isolator having opposed straight and tapered edges along which microwave energy is adapted to travel with the exception that in the subject invention the thickness of the ferrite substrate underlying one tapered edge is abruptly changed in order to obtain mismatch thereat causing energy traveling along said one tapered edge to be reflected back along the same edge to the port whence it came. Coupling a microwave power amplifier to a port of a microwave circulator by means of a respective power reflector according to the subject invention provides a simple yet effective power combiner for microwave signals.

12 Claims, 5 Drawing Figures

MICROWAVE POWER REFLECTOR USING EDGE-GUIDED MODE

The invention described herein may be manufactured and used by or for the Government for governmental purposes without the payment of any royalties thereon or therefor.

BACKGROUND OF THE INVENTION

This invention relates generally to microwave apparatus and more particularly to a microstrip device which is adapted to operate as a power reflector over a relatively wide bandwidth.

DESCRIPTION OF THE PRIOR ART

Microstrip devices operable in a edge-guided mode, i.e. the energy propagates along the edges thereof, have been described for example in U.S. Pat. Nos. 3,617,951 and 3,555,459 issued to R. Anderson and in a publication entitled "Reciprocal and Non-Reciprocal Modes of Propagation in Ferrite Stripline and Microstrip Devices", *IEEE Transactions on Microwave Theory and Techniques*, Volume MTT-19, No. 5, May 1971, pp. 442–451, M. E. Hines.

In the devices taught therein, the dominant mode resembles TEM propagation except that there is a strong transverse field displacement causing wave energy to be concentrated along the edges of a metal stripline conductor formed on the surface of a ferrite substrate located on a metal ground plane and having a magnetic field applied thereto perpendicular to the ground plane. The edges are designed to be free of abrupt changes in order that there be no abrupt impedance change in the circuit. Non-reciprocal behavior is obtained by asymmetrically loading the edges.

SUMMARY

The present invention is directed to an improvement in edge-guided mode stripline devices for providing a microwave power reflector and briefly comprises a two port device having a ground plane upon which a ferrite substrate is located and upon which a stripline conductor is formed having opposed edges coupled to the two ports and whereupon one of the edges includes an exponentially tapered segment adjacent each port. A resistive load is placed on the tapered segment adjacent one port. The ferrite substrate includes a discontinuity in its thickness under the tapered segment adjacent the other port, thereby obtaining a mismatch at the discontinuity causing any energy entering the port to be reflected back towards that port. The resistive load at the other end will absorb any energy that may tend to continue propagating toward the opposite port.

DESCRIPTION OF THE PREFERRED EMBODIMENT

For a finite width lossless ferrite stripline, it has been shown in the aforementioned Hines publication that the characteristic impedance for a single ferrite slab can be expressed by the following equation:

$$Z = \frac{h\omega\mu_0 K}{2 \tanh(\alpha_x a/2)} \quad (1)$$

Where $h$ is the substrate thickness, $\mu_0$ is equal to $4\pi \times 10^{-7}$ henrys/meters, $\omega$ is the frequency, $K$ is equal to $$\frac{\omega \omega_m}{\omega_0^2 - \omega^2},$$

$\alpha_x$ is equal to $\omega_m(\epsilon_0 \mu_0 \epsilon_r)^{1/2}$, $\omega_0$ is approximately equal to 2.8MHz per oersted of the internal magnetic field $H_i$, $\omega_m$ is approximately equal to 2.8MHz per oersted of the induced magnetization M, $\epsilon_0$ is $1/36\pi \times 10^{-9}$ farads per meter, $a$ is the width of the stripline, and $\epsilon_r$ is the dielectric constant of the ferrite.

Figure 1A:
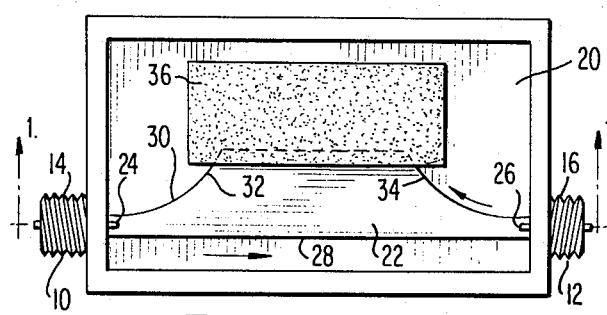
FIGS. 1A and 1B are, respectively, a top plan view and a longitudinal sectional view taken along the lines 1—1 of FIG. 1A of a prior art device.
Figure 1B:
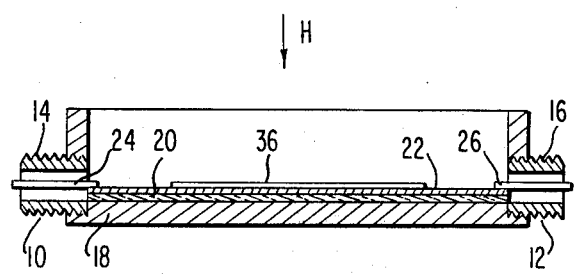

For the case of the edge-guided mode isolator, an example of which is shown in FIGS. 1A and 1B, the internal magnetic field $H_i \cong 0$, i.e. a weak internal field no greater than necessary for saturation. In such a case, $$K = \frac{\mu \omega_m}{\omega} \text{ where } \mu = 1 \quad (2)$$

As such, equation (1) becomes, $$Z = \frac{h \mu_0 \omega_m}{2 \tanh(\alpha_x a/2)} \quad (3)$$

In this special case, the impedance of the ferrite stripline no longer has a direct frequency dependence, thus allowing for broadband operation. Equation (3) also shows that the characteristic impedance Z is therefore directly proportional to the substrate thickness $h$, which property provides basis for the subject invention.

Referring now the drawings, and more particularly to FIGS. 1A and 1B, there is shown a typical prior art device known as an "edge-guided mode" isolator. This device is a two port device wherein there is an input port and an output port comprised of the coaxial connectors 10 and 12 respectively. The outer conductors 14 and 16 of the connectors mechanically couple to a metallic ground plane 18 (FIG. 1B) over which a ferrite substrate 20 is contiguously located. A stripline metal conductive layer 22 is formed on the ferrite substrate 20 as shown in FIG. 1A so that its end portions are in electrical contact with the inner conductors 24 and 26 of the coaxial connectors 10 and 12.

The conductive layer 22 includes a pair of opposed edges 28 and 30. The edge 28 comprises a substantially straight edge between the connectors 10 and 12, i.e. the two ports while the edge 30 contains a double taper comprising segments 32 and 34. Intermediate the tapered segments 32 and 34 is located a resistive film 36. Power incident at port 1 (connector 10) can be made to travel along either edge 28 or 30 of the stripline conductor 22 and exit out of port 2 (connector 12) by choosing the proper biasing magnetic field for the ferrite substrate 20. Accordingly, applying a transverse magnetic field H of predetermined magnitude perpendicular to the ground plane 18, microwave energy incident at connector 10 will travel along the edge 28 to the output connector 12. Any energy incident at the output connector 12 such as caused by some type of energy reflector means, not shown, will accordingly travel along edge 30 and more particularly the tapered segment 34 where it is then absorbed by the resistive load comprised of the film 36 placed along this edge. The tapers 30 and 34 are preferably exponential and whose length depends upon the frequency of operation.

Referring now to the preferred embodiment of the subject invention, there is disclosed a device of the type shown in FIGS. 1A and 1B wherein instead of absorbing any incident reflected power incident at the ports, it is instead returned to the port whence it came. This is provided by a discontinuity in the thickness of the substrate in the region of the tapered edge segment.

Figure 2:
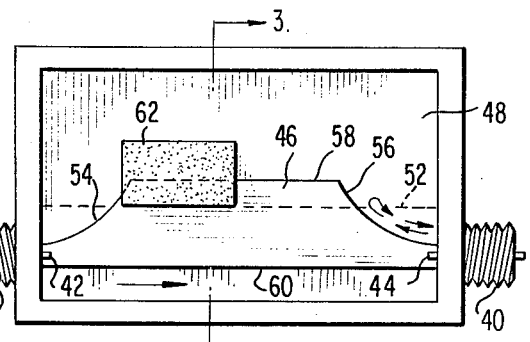
FIG. 2 is a top plan view illustrative of the preferred embodiment of the subject invention.
Figure 3:
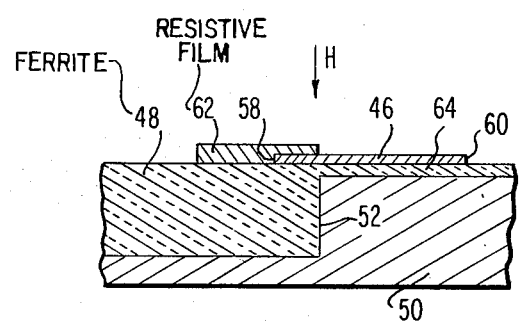
FIG. 3 is a partial cross-sectional view of the embodiment shown in FIG. 2 taken along the lines 3—3.

Referring now to FIGS. 2 and 3, the input ports are defined by the connectors 38 and 40 whose inner conductors 42 and 44 are in contact with a metal stripline conductor 46 formed on a substrate 48 located on a metal ground plane 50. FIG. 3 which is a partial cross sectional view taken along the lines 3—3 of FIG. 2, illustrates the inventive concept wherein the substrate thickness is increased, preferably in the order of 6 times, providing a discontinuity at the line 52 located beneath the exponential tapered segments 54 and 56 of the conductive edge 58. Accordingly, applying a suitable biasing magnetic field H, microwave signals applied to the input port, i.e. connector 38 will travel along the edge 60 to the output port which is the connector 40. Any energy, however, entering the output port (connector 40) will travel along the exponential taper segment 56 to the point of discontinuity of the ferrite substrate thickness, that is, at line 52 where a mismatch occurs causing the energy to be reflected back to the connector 40. As a matter of precaution, a small resistive film portion 62 is applied to the edge 58 preferably near its opposite extremity in the vicinity of the taper 54 to absorb any energy that might continue along the edge 58 in spite of the mismatch provided by the increased thickness of the ferrite in the region beneath edge 58 shown in FIG. 3.

As an illustrative example, assume a reflection of 50% is desired. This corresponds to a voltage reflection coefficient of 0.707. If the impedance of the transmission line along the edges 58 and 60 is approximately 50 ohms, then the impedance of the mismatch occurring at the line 52 will be 0.707 ($Z_r$ + 50) where Z is the reflected impedance. Where the thickness of the substrate 48 in the region 64 under the edge 60 is for example 0.025 inches, the ferrite thickness beneath the return edge 58 will then accordingly have to be approximately 6 times the thickness of the region 64 or (6 × 0.025) inches.

Figure 4:
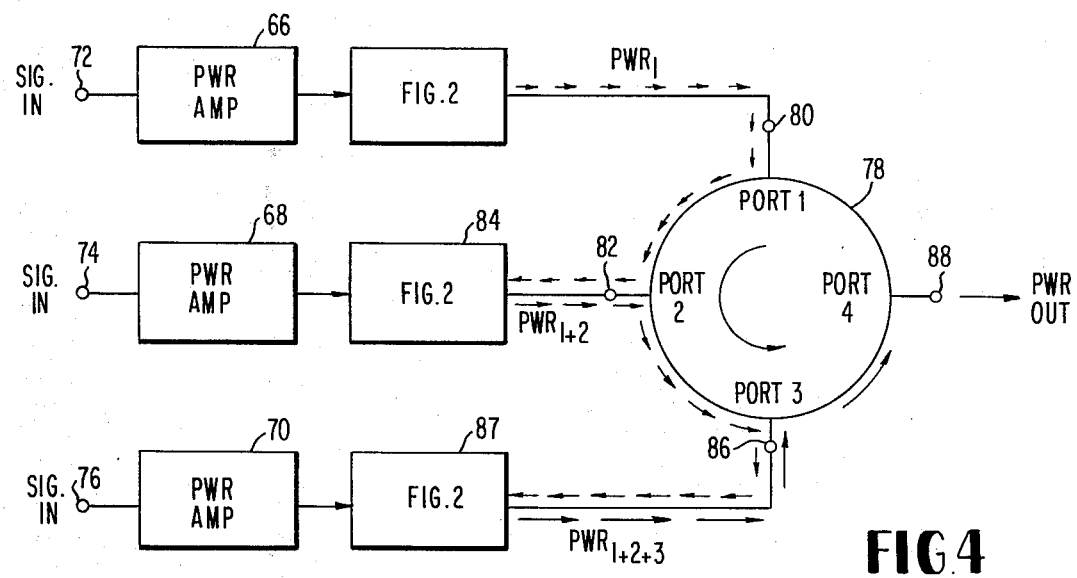
FIG. 4 is a block diagram illustrative of a power combiner system utilizing the device of the subject invention.

The subject invention is particularly adapted for use in a power combiner network such as shown in FIG. 4 wherein a plurality of power amplifiers 66, 68 and 70 having respective input signals applied to terminals 72, 74 and 76 are applied, for example, to a four port circulator device 78. Each of the power amplifiers 66, 68 and 70 are respectively coupled to ports 1, 2 and 3 of the circulator 78, through the device shown in FIG. 2. The power from amplifier 66 will be applied to port 1 via terminal 80 and be fed out of port 2 to terminal 82. However, the reflective characteristic of the subject invention will cause the power flowing to the device 84 to be immmediately reflected therefrom while at the same time coupling the power from power amplifier 68. The power at port 2 then will be the combined power ($P_1 + P_2$) of amplifiers 66 and 68 which is then translated to port 3. The power at port 3 is outputted at terminal 86 where it is reflected from the device 87 while at the same time combining with the power from the amplifier 70 providing an input power ($P_1 + P_2 + P_3$) of the combined amplifiers 66, 68 and 70 back to port 3 where it is then translated to port 4 and outputted at terminal 88. The energy is thus combined in a cumulative process until all the signals have been combined and transmitted out of a common port of the circulator 78.

Accordingly what has been shown and described is an improved edge-guided mode ferrite stripline device similar to an isolator but which has the added feature of substantially reflecting all incident power back to the port where it entered, thus making it readily adaptable for a power combining operation.

Having thus shown and described what is at present considered to be the preferred embodiment of the subject invention,

I claim:

1. A microwave transmission device having a planar stripline conductor coupled between a pair of signal ports, being formed on a ferromagnetic substrate contiguous with a ground plane and having a biasing magnetic field of a predetermined magnitude applied thereto transverse to said ground plane to effect energy travel along at least one edge of said stripline conductor between said signal ports, the improvement comprising:

a discontinuity in the thickness of the substrate in the region of said one edge whereby an impedance mismatch is produced causing energy traveling along said one edge to be reflected back in the direction from whence it came.

2. The device as defined by claim 1 wherein said one edge includes a tapered segment.

3. A device as defined by claim 2 wherein said tapered segment substantially defines an exponential taper and wherein said thickness discontinuity is proximally located to said tapered segment.

4. The device as defined by claim 1 and additionally including another edge opposite said one edge, said another edge being located proximally to a region of uniform thickness of said substrate away from said thickness discontinuity.

5. The device as defined by claim 4 wherein said region of uniform thickness is substantially less than the thickness beyond said discontinuity.

6. The device as defined by claim 5 wherein said thickness changes by a factor of substantially six to one.

7. The device as defined by claim 1 wherein said one edge includes a tapered segment and said thickness discontinuity is located at said tapered segment, and additionally including another but substantially linear edge opposite said one edge, and wherein said thickness discontinuity runs substantially parallel to said another edge.

8. The device as defined by claim 7 wherein said tapered segment is located adjacent one of said signal ports, and wherein said one edge includes a second tapered segment located adjacent the other of said signal ports.

9. The device as defined by claim 8 and additionally including resistive load means coupled to said one edge a selected distance away from said first recited tapered segment for absorbing energy not reflected back to said one signal port, due to the mismatch produced by said thickness discontinuity.

10. The device as defined by claim 9 wherein said load means is located adjacent said second tapered segment.

11. The device as defined by claim 9 and wherein said load means is located intermediate said tapered segments.

12. The device as defined by claim 9 wherein said load means comprises a resistive film.

* * * * *